(12) United States Patent
Liu

(10) Patent No.: US 6,403,386 B1
(45) Date of Patent: Jun. 11, 2002

(54) METHOD AND APPARATUS FOR IDENTIFYING FAILURE SITES ON IC CHIPS

(75) Inventor: Chin-Kai Liu, Hsin-Chu (TW)

(73) Assignee: Taiwan Semiconductor Manufacturing Co., Ltd, Hsin Chu (TW)

(*) Notice: Subject to any disclaimer, the term of this patent is extended or adjusted under 35 U.S.C. 154(b) by 0 days.

(21) Appl. No.: 09/645,080

(22) Filed: Aug. 24, 2000

Related U.S. Application Data

(62) Division of application No. 09/007,024, filed on Jan. 14, 1998, now Pat. No. 6,121,059.

(51) Int. Cl.[7] .............................................. H01L 21/66
(52) U.S. Cl. ............................ 438/14; 438/4; 438/16; 324/750; 324/753
(58) Field of Search .................. 438/5–17; 324/750, 324/755, 760, 770, 753

(56) References Cited

U.S. PATENT DOCUMENTS

| | | | | |
|---|---|---|---|---|
| 5,008,617 A | * | 4/1991 | Czubatyj et al. | 438/17 |
| 5,258,705 A | * | 11/1993 | Okamoto et al. | 324/770 |
| 5,394,098 A | * | 2/1995 | Meyrueix et al. | 324/750 |
| 5,504,017 A | * | 4/1996 | Yue et al. | 438/17 |
| 5,777,487 A | * | 7/1998 | Burgess et al. | 324/756 |
| 5,804,980 A | * | 9/1998 | Nikawa | 324/752 |
| 5,963,040 A | * | 10/1999 | Liu | 324/551 |

* cited by examiner

Primary Examiner—Kevin M. Picardat
(74) Attorney, Agent, or Firm—Randy W. Tung

(57) ABSTRACT

The present invention provides a method for identifying failure sites on a defective IC chip by utilizing a glass substrate equipped with a heating device and then coating a liquid crystal material layer on top. The liquid crystal device can be positioned in contact, or immediately adjacent to a surface of an IC device to be detected. After the liquid crystal temperature is raised to just below its transition temperature, a voltage signal can be fed into the IC device to trigger an overheating at a short or leakage to raise the liquid crystal material immediately adjacent to the short or leakage to a temperature above its transition temperature. Hot spots are thus produced to appear as bright spots for easy identification under an optical microscope.

11 Claims, 2 Drawing Sheets

METHOD AND APPARATUS FOR IDENTIFYING FAILURE SITES ON IC CHIPS

This is a divisional of application(s) Ser. No. 09/007,024 filed on Jan. 14, 1998 now U.S. Pat. No. 6,121,059.

FIELD OF THE INVENTION

The present invention generally relates to a method and apparatus for identifying failure sites on IC chips by a liquid crystal method and more particularly, relates to a method and apparatus for identifying failure sites on IC chips by a liquid crystal/glass substrate which is positioned in intimate contact with a top surface of an IC chip with the liquid crystal layer heated to a temperature just below its transition temperature such that any shorts or leakages in the IC chip will heat up the immediately adjacent liquid crystal material to pass its transition temperature and thus revealing a hot spot for identifying the failure site.

BACKGROUND OF THE INVENTION

In the semiconductor fabrication technology, the capability and effectiveness of performing a failure analysis on a semiconductor chip package are very important. When an integrated circuit (IC) chip fails in service the nature and the cause for such failure must be determined in order to prevent the reoccurrence of such failure in similar products.

An IC chip is normally built on a silicon base substrate with many layers of insulating materials and metal interconnections. This type of multi-layer structure becomes more important in modern IC devices such as high density memory chips where, in order to save chip real estate, the active device is built upwards in many layers forming transistors, capacitors and other logic components.

When an IC device is found defective during a quality control test, various failure analysis techniques can be used to determine the cause of such failure. Two of the more recently developed techniques for performing failure analysis are the infrared light emission microscopy and the light-induced voltage alteration (LIVA) imaging technique. In the infrared light emission light analysis, an infrared light transmitted through a substrate silicon material is used to observe from the backside of an IC the failure mode of the circuit. For instance, at a magnification ratio of 100x, a failure point in the circuitry can be located. The LIVA imaging technique can be used to locate open-circuited and damaged junctions and to image transistor logic states. The LIVA images are produced by monitoring the voltage fluctuation of a constant current power supply when a laser beam is scanned over an IC. A high selectivity for locating defects is possible with the LIVA technique.

Another method that has become more common in failure analysis of IC chips is the scanning optical microscopy (SOM). The high focusing capability of SOM provides improved image resolution and depth comparable to conventional optical microscopy. It is a useful tool based on the laser beam's interaction with the IC. The SOM technique enables the localization of photocurrents to produce optical beam induced current image that show junction regions and transistor logic states. Several major benefits are made possible by the SOM method when compared to a conventional scanning electron microscopy analysis. For instance, the benefits include the relative ease of making IC electrical connection, the no longer required vacuum system and the absence of ionizing radiation effects.

Even though the above discussed techniques are effective in identifying failure modes in IC circuits, the techniques require elaborate and complicated electronic equipment which are generally costly and not readily available in a semiconductor fabrication facility. It is therefore desirable to have available a method and apparatus that can be easily carried out without expensive laboratory equipment and thus the apparatus can be installed in any fabrication facilities. One of such methods is the use of a liquid crystal coating layer for the identification of failure sites in an IC chip. For instance, in a conventional method wherein a liquid crystal layer is used for the identification of failure sites, a liquid crystal material is frequently coated on top of an IC chip or an IC package. A typical set up is shown in FIG. 1.

As shown in FIG. 1 a typical liquid crystal detection apparatus 10 is provided. The apparatus 10 generally includes a heater 12 and an optical microscope 14. On a top surface 16 of the heater 12, an IC package 20 is positioned under the microscope 14 The IC package 20 may be a plastic quad flat pack (PQFP) or any other packaged IC device. The IC package 20, shown in FIG. 1, is completed with bonding pads 22 and bonding wires 24. In the middle portion of the package 20 are IC circuits that contain failure sites need to be identified by a liquid crystal method. In the conventional method, a liquid crystal material is first coated to the top surface 26 of the IC package 20. The IC package 20 is then positioned in top of the heater 12 which can be heated at a pre-programmed heating rate to a specific temperature. The IC package 20, together with the coated liquid crystal layer (not shown) is normally heated to a temperature just below the clear/opaque transition temperature of the liquid crystal material. For instance, a suitable temperature would be approximately between about 5° and about 10° below the transition temperature of the liquid crystal. After the IC package 20 is heated to such predetermined temperature, a pre-selected voltage is applied to the IC circuit through bonding wires 24. The IC circuit, upon receiving such a voltage, heats up at any short or leakage positions. A hot spot is thus generated at each of such locations. The liquid crystal material immediately adjacent, or contacting such hot spots therefore has its temperature raised above its transition temperature and transforms from an opaque state to a clear state. As a result, bright spots in the liquid crystal layer, i.e., on the IC package, show up to indicate the failure sites in the package.

Several drawbacks have been noted in the practice of the above described conventional method. First, a new coating of a liquid crystal material must be applied to each IC package or each IC chip to be examined under the microscope. The liquid crystal material once applied, is not reusable. i.e., cannot be transferred to another IC device. The coating and the drying process for the liquid crystal material for each IC package to be examined increase the complexity of the method. Secondly, the entire IC package, or the IC chip must be heated on the heater in order to bring the temperature of the liquid crystal coating layer to just below its transition temperature. Due to the large mass of the material to be heated, the exact temperature of the IC package is not only difficult to control but also requires a long time for heating to such temperature. Furthermore, the IC package requires a long time to cool once the temperature is heated passing its transition temperature. This further requires longer processing time It is therefore an object of the present invention to provide a method for identifying failure sites on a defective IC chip that does not have the drawbacks and shortcomings of the conventional method of using liquid crystal material.

It is another object of the present invention to provide a method for identifying failure sites on a defective IC chip by utilizing a reusable liquid crystal apparatus such that each IC chip to be tested does not require a separate coating of a liquid crystal material.

It is a further object of the present invention to provide a method for identifying failure sites on a defective IC chip by utilizing a liquid crystal apparatus constructed by coating a liquid crystal material on a substantially transparent substrate.

It is another further object of the present invention to provide a method for identifying failure sites on a defective IC chip by utilizing a liquid crystal apparatus wherein a substrate equipped with heating elements is coated with a liquid crystal material to form a reusable liquid crystal apparatus.

It is still another object of the present invention to provide a method for identifying failure sites on a defective IC chip by utilizing a liquid crystal apparatus which is fabricated on a glass substrate heated by metal coatings of chromium, platinum or tungsten,.

It is yet another object of the present invention to provide a method for identifying failure sites on a defective IC package by mounting a liquid crystal device to an IC chip with a thermally conductive fluid medium thereinbetween to facilitate the heat transfer between the device and the chip.

It is yet another further object of the present invention to provide an apparatus for identifying failure sites on a defective IC package which consists of a substantially transparent glass substrate equipped with heating means and coated with a liquid crystal material, and a power supply capable of supplying a DC power to the substrate such that the liquid crystal material can be heated to a temperature just below its transition temperature when the apparatus is placed in contact with a defective IC chip.

It is still another further object of the present invention to provide an apparatus for identifying failure sites on a defective IC chip which includes a substantially glass substrate that can be heated and a liquid crystal coating thereon such that the apparatus can be mounted to an IC package with a thermally conducive fluid medium thereinbetween for improving the heat transfer between the apparatus and the chip.

SUMMARY OF THE INVENTION

In accordance with the present invention, a method and apparatus for identifying failure sites on a defective IC package or chip by utilizing a reusable liquid crystal device which can be mounted to various IC chips for detecting failure sites are provided.

In a preferred embodiment. a method for identifying failure sites on an IC chip can be carried out by the operating steps of first providing a substrate that is substantially transparent, then coating an electrically conductive material layer on a first side of the substrate while substantially retaining the transparency of the substrate, then coating a layer of liquid crystal on a second side of the substrate, then positioning the substrate. with the second side contacting a top surface of an IC device to be tested, then flowing an electrical current through the electrically conductive material layer and heating the liquid crystal material to a temperature not higher than its transition temperature, and then inputting a signal to the IC device and detecting hot spots formed under an optical microscope. The method may further include the step of providing a thermally conductive fluid between the substrate and the top surface of the IC device. The thermally conductive fluid may be conveniently a liquid glycerin for facilitating heat transfer between the substrate and the IC device. The substantially transparent substrate may be advantageously a glass substrate. The electrically conductive material layer may be coated on the substrate in a serpentine pattern or along an outer periphery of the first side of the substrate while substantially retaining the transparency of the substrate. The liquid crystal material coated has a clear/opaque transition temperature which may also be coated on the first side of the substrate on top of the electrically conductive material layer. The method may further include a step of flowing an electrical current between about 1 volt DC and about 50 volt DC through the electrically conductive material layer for heating the liquid crystal material to a temperature not higher than its transition temperature, and preferably to a temperature not more than 10° C. below its transition temperature.

The present invention is further directed to a liquid crystal coated apparatus for use in failure site identification that includes substrate which is substantially transparent, a layer of electrically conductive material on a first side of the substrate, the layer of electrically conductive material has a thickness that does not affect the transparency of the substrate, a layer of a liquid crystal material on a second side of the substrate opposite to the first side, and a power supply capable of flowing an electrical current through the electrically conductive material layer and heating the liquid crystal material to a temperature not higher than its transition temperature. The liquid crystal coated apparatus can be used by positioning in contact with a surface of an IC device, optionally with a thermally conductive fluid medium sandwiched thereinbetween. The thermally conductive fluid sandwiched may be a liquid glycerin for improving heat transfer between the apparatus and the IC device. The power supply is capable of supplying a DC current between about 1 volt and about 50 volt. The liquid crystal material coated has a clear/opaque transition temperature between about 20° C. and about 90° C. The substantially transparent substrate on which the liquid crystal material is coated can be a glass substrate. The electrically conductive material coating layer can be formed of a metal such as chromium. platinum or tungsten in a serpentine pattern or along an outer periphery of the substrate. The present invention liquid crystal coated apparatus can be repeatedly used for detecting hot spots on IC devices.

The present invention is further directed to a method for detecting hot spots on a defective IC device which can be carried out by the steps of providing a substrate that is substantially transparent, coating an electrically conductive material on the first side of the substrate while substantially retaining the transparency of the substrate, coating a layer of liquid crystal material having a clear/opaque transition temperature on a second side of the substrate, contacting the substrate with the liquid crystal layer to a top surface of an IC device, flowing an electrical current between about 1 volt DC and about 50 volt DC through the electrically conductive material layer and heating the liquid crystal material to a temperature not higher than its transition temperature, and inputting a signal to the IC device and detecting hot spots formed under a optical microscope. The method may further include the step of providing a thermally conductive fluid sandwiched in-between the substrate and the IC device. The method may also include the step of removing the substrate from the IC device and mounting the substrate to another IC device to be tested. The method may heat the liquid crystal material to a temperature not more than 5° C. below its clear/opaque transition temperature.

BRIEF DESCRIPTION OF THE DRAWINGS

These and other objects, features and advantages of the present invention will become apparent from the following detailed description and the appended drawings in which.

DETAILED DESCRIPTION OF THE PREFERRED EMBODIMENTS

Figure 1:
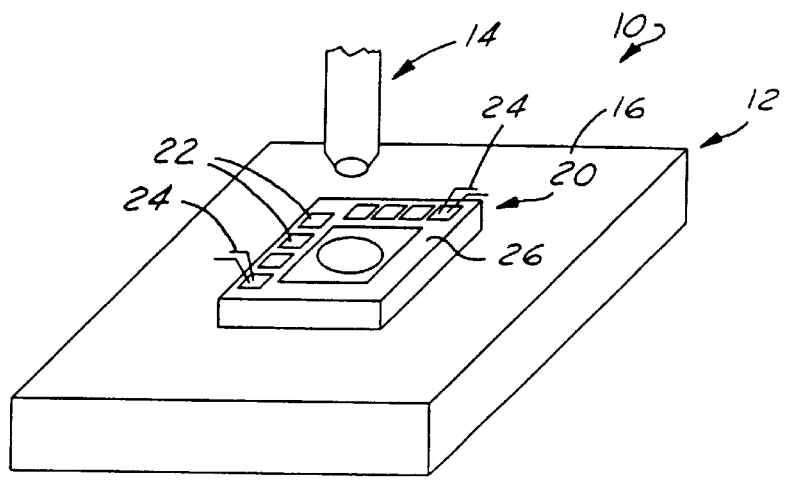
FIG. 1 is a perspective view of a set-up of a conventional method for detecting hot spots with a liquid crystal coating applied on an IC package.

The present invention discloses a method and apparatus for identifying failure sites on defective IC chips or packages by utilizing a substantially transparent heatable substrate coated with a liquid crystal material and a power supply such that the liquid crystal coated thereon can be heated to a temperature just below its transition temperature when the substrate is positioned in contact with an IC device to be tested. A voltage signal is then fed to the IC device to cause the overheating of a short or a leakage such that the immediately adjacent liquid crystal material is heated pass its transition temperature and thus appearing as hot spots.

The present invention utilizes a unique property of the liquid crystal material of a clear/opaque transition state for detecting failure sites on defective IC circuits. The liquid crystal material goes through an opaque to clear transition at a specific transition temperature that is unique for the material. For instance most of the transition temperatures for commercially available liquid crystal materials fall between 20° C. and 50° C. which is a convenient range for use in the present invention. A hot spot, which is indicative of a failure site, is not generated under normal operations in an IC chip. It is only generated when there is a short or a leakage in the circuit, and thus under abnormal conditions. The present invention novel method and apparatus can be used to pin point a localized failure site in the IC circuit. In practicing the present invention novel method, an IC device or package that has previously failed a functioning test is provided such that the exact location of the failure point can be identified.

In the present invention method, a liquid crystal layer is first heated to a temperature just below its transition temperature. After the liquid crystal material is placed in contact or immediately adjacent to a surface of an IC chip, a voltage signal is sent through the IC circuit to cause a short or leakage in the circuit to overheat. The heat generated by the short or leakage, even though a small amount, is sufficient to heat the immediately adjacent liquid crystal material on top of the short or leakage to a temperature above its transition temperature. A bright spot, or a hot spot, is therefore exhibited at such short or leakage locations. In practice, the hot spot shows up in a flashing manner since heat generated by the short or the leakage is quickly absorbed by the neighboring liquid crystal material and thus the liquid crystal that was above the transition temperature loses its brightness until more heat is produced by the short or leakage to again raise its temperature above the transition temperature.

The present invention novel method provides greatly improved results over that made possible by the conventional method. For instance, the present invention liquid crystal device can be reused for an unlimited number of times as long as it is not physically damaged. The glass substrate coated with the liquid crystal material can be simply removed from an IC device, and rinsed if glycerin was used for heat transfer, and be ready for use on a second IC device for detection. Secondly, the present invention liquid crystal device can be heated easily due to its small mass. A more accurate temperature control of the liquid crystal device is therefore possible when compared to the conventional method. The liquid crystal device of the present invention can also be heated in a substantially shorter time period due to its small mass. Since liquid crystal materials are generally toxic or poisonous, it is highly desirable to minimize any human contact with the liquid crystal materials when existed in a solution form during the coating process. The present invention liquid crystal material, once coated and dried, minimizes such exposure and thus eliminates health hazard.

Figure 2A:
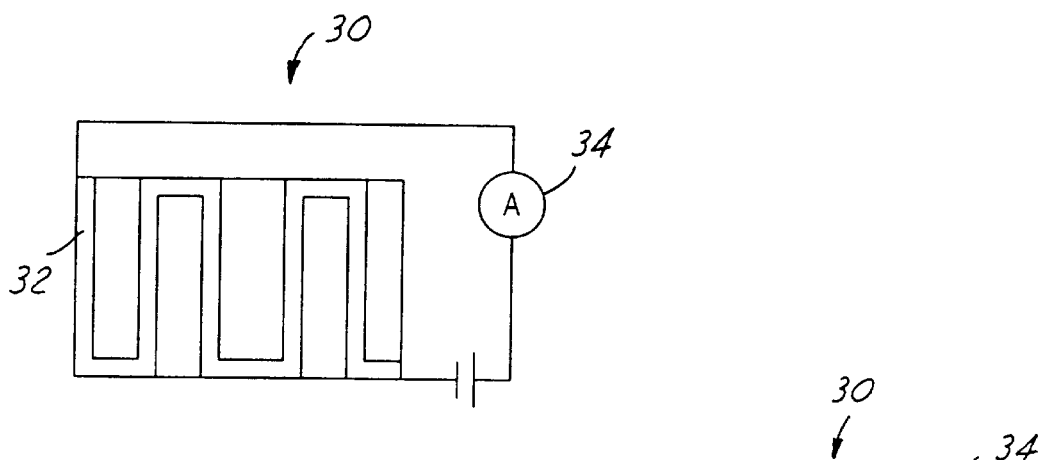
FIG. 2A is a present invention substrate having an electrically conductive material coated on top in a serpentine pattern.

Referring now to FIG. 2A, wherein a present invention glass substrate 30 is shown. The glass substrate, or a substrate of any other material as long as it is substantially transparent, is coated with a metallic coating layer 32 in a serpentine pattern. The substrate may have a thickness of less than 1 mm or any other suitable thicknesses. A suitable electrically conductive material for coating the substrate may be a metal such as chromium, platinum, tungsten or any other suitable metal. The serpentine pattern shown in FIG. 2A is only one of many possible configurations in coating the electrically conductive material. The serpentine pattern is used to improve the even heating of the substrate 30. Any other pattern as long as capable of uniformly heating the substrate may also be suitably used. The serpentine-shaped heating element 32 formed of an electrically conductive metal is deposited by a sputtering technique. The film deposited should be sufficiently thin such that transparency of the glass substrate 30 is not significantly affected. In other words, the transparency of the substrate 30 must be substantially retained after the coating process of the electrically conductive material. The serpentine-shaped heating element 32 is connected at its two extreme ends to a power supply or amplifier 34. A DC current can be conveniently used to heat the substrate. A suitable DC current is between about 1 volt and about 50 volt, and preferably between about 10 volt and about 20 volt.

Figure 2B:
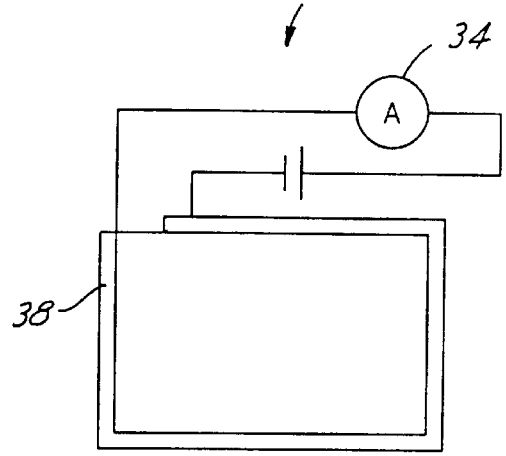
FIG. 2B is a present invention substrate having an electrically conductive material coated along an outer periphery of the substrate.

FIG. 2B shows an alternate embodiment of the present invention substrate 30. A layer of an electrically conductive material 38 is coated by a method such as sputtering on an outer periphery of the substrate 30. This pattern also allows an uniform heating of the substrate when a voltage is applied from the amplifier 34. Any other electrically conductive material, i.e., other than metal, may also be used in heating the present invention substrate. For instance, an electrically conductive and substantially transparent polymeric film may be laminated to the surface of the substrate for achieving the same desirable heating result. The heating method for the present invention substrate is therefore in no way limited to those embodiments shown in FIGS. 2A and 2B.

Figure 3:
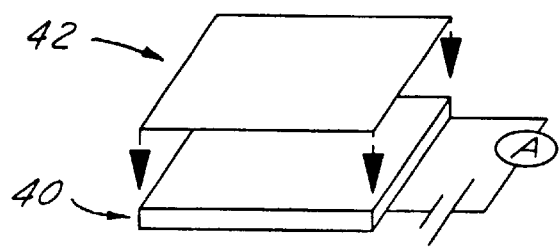
FIG. 3 is a perspective view of the present invention substrate with a liquid crystal layer coated thereon.

A liquid crystal material, such as a commercially available Liquid Crystal A supplied by Technology Associates can be first dissolved in a suitable solvent and then coated on the substrate 40 in a thin film 42 as shown in FIG. 3. The liquid crystal thin film 42. once coated on the substrate 40 is dried into a solid film. A suitable dimension of the substrate is a square of approximately 1.5 cm width.

Figure 4:
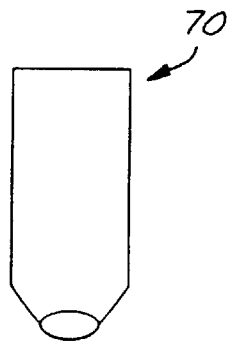
FIG. 4 is a perspective view of the present invention method utilizing the reusable liquid crystal coated substrate and a thermally conductive material layer between the substrate and an IC device.
Figure 4:
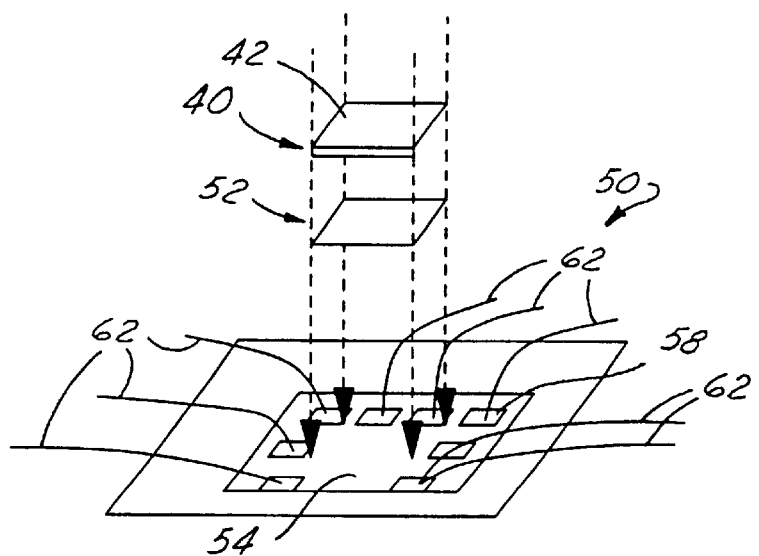

A method to carry out the present invention is shown in FIG. 4. The substrate 40, having a liquid crystal coating layer 42 deposited on top, is mounted to an IC device 50.

The mounting of the substrate 40 to the IC device 50 may optionally include a thermally conductive layer 52 which can be conveniently a glycerin liquid. The thermally conductive layer 52 further improves the heat conductance between the substrate 40 and the top surface 54 of the IC device 50. On top of the IC device 50, bonding pads 58 and bonding wires 62 are provided. The bonding wires 52 can be used for inputting a signal to the IC device 50 for producing hot spots at the failure sites. A power supply (not shown) is also used to preheat the substrate 40 such that the liquid crystal coating layer 42 is raised to a temperature just below its transition temperature. After a voltage signal is fed into the IC device 50 through bonding wires 62, an optical microscope 70 is used to observe the hot spots generated on the top surface 54 of the device 50. The transition temperature for the liquid crystal material utilized is normally between about 20° C. and about 90° C., and preferably between about 30° C. and about 50° C.

When compared to the conventional method in which an IC package must be heated on its backside in a very insufficient manner, and a liquid crystal coating must be applied to each of the IC package to be tested, the present invention novel method provides a greatly improved technique for detecting failure sites. Not only the liquid crystal device can be repeatedly used on unlimited number of IC devices, the small mass of the liquid crystal device (i.e., the liquid crystal coating and the glass substrate) makes it very easy to heat and to achieve an accurate temperature control. The present invention novel method and apparatus have therefore been amply demonstrated in the above descriptions and the appended drawings FIGS. 2A–4.

While the present invention has been described in an illustrative manner it should be understood that the terminology used is intended to be in a nature of words of description rather than of limitation.

Furthermore, while the present invention has been described in terms of a preferred embodiment, it is to be appreciated that those skilled in the art will readily apply these teachings to other possible variations of the inventions.

The embodiment of the invention in which an exclusive property or privilege is claimed are defined as follows:

1. A liquid crystal coated apparatus for use in failure site identification comprising:

a substrate that is transparent, a layer of electrically conductive material on a first side of said substrate, said layer of electrically conductive material having a thickness that does not affect the transparency of the substrate, a layer of a liquid crystal material on a second side of the substrate opposite to said first side, and a power supply capable of flowing an electrical current through said electrically conductive material layer and heating said liquid crystal material to a temperature not higher than its transition temperature.

2. A liquid crystal coated apparatus for use in failure site identification according to claim 1, wherein said apparatus is positioned in contact with a surface of an IC device.

3. A liquid crystal coated apparatus for use in failure site identification according to claim 1, wherein said apparatus is positioned in contact with a top surface of an IC device with a thermally conductive fluid sandwiched thereinbetween.

4. A liquid crystal coated apparatus for use in failure site identification according to claim 1, wherein said apparatus is positioned in contact with a top surface of an IC device and a liquid glycerin sandwiched thereinbetween for improved heat transfer.

5. A liquid crystal coated apparatus for use in failure site identification according to claim 1, wherein said power supply is capable of supplying a DC current between about 1 volt and about 50 volt.

6. A liquid crystal coated apparatus for use in failure site identification according to claim 1, wherein said liquid crystal material has a clear/opaque transition temperature between about 20° C. and about 90° C.

7. A liquid crystal coated apparatus for use in failure site identification according to claim 1, wherein said transparent substrate is a glass substrate.

8. A liquid crystal coated apparatus for use in failure site identification according to claim 1, wherein said electrically conductive material coating layer is formed of a metal selected from the group consisting of chromium platinum and tungsten.

9. A liquid crystal coated apparatus for use in failure site identification according to claim 1, wherein said electrically conductive material coating on said substrate is formed in a serpentine pattern.

10. A liquid crystal coated apparatus for use in failure site identification according to claim 1, wherein said electrically conductive material layer coated on said substrate is formed along an outer periphery of said substrate.

11. A liquid crystal coated apparatus for use in failure site identification according to claim 1, wherein said apparatus can be repeatedly used for detecting hot spots on IC devices.

* * * * *